United States Patent
Gore et al.

(10) Patent No.: US 7,410,816 B2
(45) Date of Patent: Aug. 12, 2008

(54) METHOD FOR FORMING A CHAMBER IN AN ELECTRONIC DEVICE AND DEVICE FORMED THEREBY

(76) Inventors: Makarand Gore, 1210 NE. Conroy Pl., Corvallis, OR (US) 97330; James Guo, 1986 NW. Lance Pl., Corvallis, OR (US) 97330

(*) Notice: Subject to any disclaimer, the term of this patent is extended or adjusted under 35 U.S.C. 154(b) by 507 days.

(21) Appl. No.: 10/807,887

(22) Filed: Mar. 24, 2004

(65) Prior Publication Data

US 2005/0214969 A1 Sep. 29, 2005

(51) Int. Cl.
 *H01L 21/00* (2006.01)
(52) U.S. Cl. .................. 438/22; 438/27; 438/65; 438/116
(58) Field of Classification Search .......... 438/22, 438/26, 27, 64, 65, 112, 116, 124–127, 50–53; 257/687, 680, 704
See application file for complete search history.

(56) References Cited

U.S. PATENT DOCUMENTS

| | | |
|---|---|---|
| 4,838,991 A | 6/1989 | Cote et al. |
| 5,238,877 A | 8/1993 | Russell |
| 5,475,379 A | 12/1995 | George et al. |
| 5,567,660 A | 10/1996 | Chen et al. |
| 5,841,931 A | 11/1998 | Foresi et al. |
| 6,108,464 A | 8/2000 | Foresi et al. |
| 6,297,069 B1 * | 10/2001 | Zappella et al. ............ 438/53 |
| 6,302,523 B1 | 10/2001 | Smith et al. |
| 6,335,224 B1 * | 1/2002 | Peterson et al. ............ 438/114 |
| 6,353,257 B1 * | 3/2002 | Huang ................. 257/704 |
| 6,411,754 B1 | 6/2002 | Akkaraju et al. |
| 6,473,545 B2 | 10/2002 | Akkaraju et al. |
| 6,531,341 B1 | 3/2003 | Peterson et al. |
| 6,535,388 B1 * | 3/2003 | Garcia ................. 257/687 |
| 6,580,858 B2 | 6/2003 | Chen et al. |
| 6,627,496 B1 | 9/2003 | Schindler et al. |
| 6,841,859 B1 * | 1/2005 | Thamby et al. ............ 257/676 |
| 6,900,531 B2 * | 5/2005 | Foong et al. ............ 257/687 |

FOREIGN PATENT DOCUMENTS

| | | |
|---|---|---|
| EP | 1 359 455 A2 | 11/2003 |
| WO | WO 02/18756 A1 | 3/2002 |
| WO | WO 2004/009489 A2 | 1/2004 |

* cited by examiner

*Primary Examiner*—Kevin M. Picardat

(57) ABSTRACT

A method is disclosed for forming a chamber in an electronic device, including the steps of preparing an outer surface on a solidified core material, the solidified core material in a depression formed in a substrate. The method further includes establishing a layer on the prepared outer surface of the solidified core material and a portion of the substrate surrounding the depression. The established layer and the substrate define a chamber.

24 Claims, 3 Drawing Sheets

⇩ REMOVAL OF CORE MATERIAL

METHOD FOR FORMING A CHAMBER IN AN ELECTRONIC DEVICE AND DEVICE FORMED THEREBY

BACKGROUND

Numerous semiconductor devices include a formed chamber utilized for a variety of reasons. For example, inkjet devices include chambers created to contain inks propelled by evolution of a bubble or the like. In fluid light engine devices, chambers are utilized that contain a fluid or gaseous material and various light control devices. Given the demand for such devices, there exists a need for large-scale, reliable methods of manufacture of such devices. It is desirable that methods of manufacture address problems that have been inherent in prior processes. Examples of such problems include but are not limited to control of material registration, material breakage, boundary leakage, and breakage caused by mechanical stress induced during assembly processes, such as staking and interface bonding stability.

Furthermore, some microelectromechanical (MEMS) devices utilize a fluid material contained in a defined cavity to facilitate function of the MEMS device. Device assembly processes include a fluid fill step or process. The fluid fill process can be complex in that optimal sealing of the cavity must occur without leaks, bubbles, and the like. Thus, it would be desirable to provide a process and a resulting electronic device in which a fluid or fluidizable material can be introduced during the assembly process in a manner that reduces leakage, bubbles, voids, and the like.

DETAILED DESCRIPTION

Figure 1:
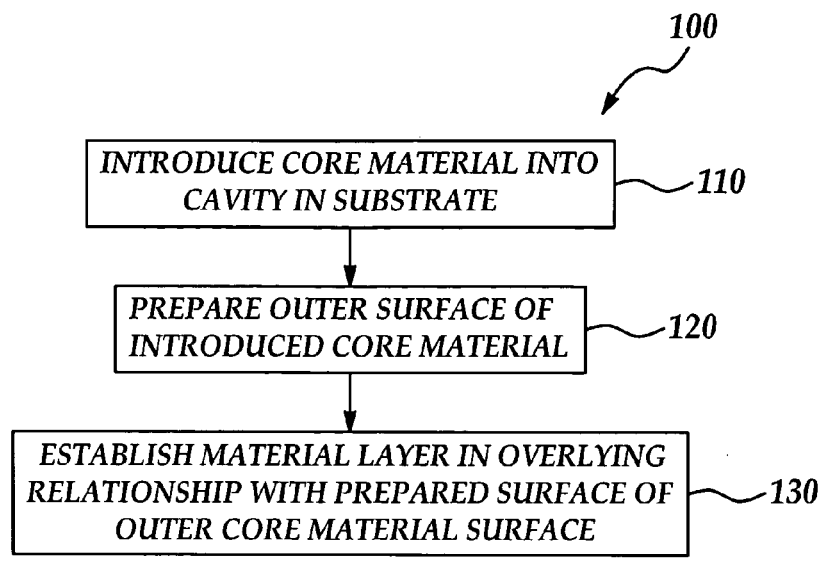
FIG. 1 is a process flow diagram of an embodiment of a formation method disclosed herein.

Example embodiments of the present invention will now be described more fully hereinafter with reference to the accompanying drawings, in which the various embodiments are shown. This invention may, however, be embodied in different forms and should not be construed as limited to the embodiments set forth herein. Rather, these embodiments are provided so that this disclosure will be thorough and complete and will fully convey the scope of the invention to those skilled in the art. In the drawings, the thicknesses of layers and regions are exaggerated for clarity. Like numbers refer to like elements throughout.

Disclosed herein is a method for forming at least one chamber in an electronic device such as an integrated circuit device. Integrated circuit devices of the type contemplated herein include, but are not limited to, microelectromechanical devices, particularly optical microelectromechanical devices. Such devices can be employed in a variety of systems and devices. Nonlimiting examples of such systems include display devices such as spatial light modulators and the like.

In the method disclosed herein, a suitable outer surface is prepared on a solidified core material present in conforming relationship with a geometric depression formed in a substrate. Once the outer surface of the core material is suitably prepared, a material layer is deposited in overlying relationship with the outer surface of the core material and substrate at least in the region surrounding the geometric depression such that the deposited material layer and the substrate define a chamber.

Preparation of the outer surface of the solidified core material can be by any suitable method that provides appropriate characteristics such as planarity. Examples of such processes include, but are not limited to, polishing, planing, and the like. Polishing may be accomplished by suitable processes that act appropriately on the solidified core material. These can include, but need not be limited to, suitable wet or dry etching processes as well as mechanical and/or chemical processes for providing the outer surface of the solidified core material with desired planarity.

At least one material layer is deposited in overlying relationship with the prepared outer surface of the solidified core material and to the substrate surrounding the geometric depression in which the solidified core material is positioned. Deposition of the material layer may be accomplished by any deposition method capable of permitting suitably uniform formation of a layer in overlying relationship to the substrate having an inner face proximate to a chamber defined by the deposited layer and the substrate having planar and surface characteristics defined by the outer surface of the solidified core material.

As defined herein, the term "solidified" is taken to mean having sufficient characteristics of a solid to permit operations on at least one surface and to permit deposition of a suitable material thereon.

In embodiments of methods disclosed herein, as depicted in the process diagram in FIG. 1, in order to form a chamber in an electronic device, a suitable core material may be introduced into a geometric depression in substrate as at reference numeral 110. As used herein, the term "substrate" is given broad definitional meaning to include any base support material and build structures typically found in electronic devices such as integrated circuit devices. It is contemplated that the substrate can be composed of suitable semiconductor materials and configured in a suitable manner.

The geometric depression or cavity can have any suitable configuration appropriate for the ultimate end use of the associated electronic device. The depression defined in the substrate may be formed by any suitable fabrication process. These processes typically contemplate various wet or dry etching techniques. However, where appropriate, it is contemplated that the geometric depression may be formed by appropriate additive techniques including, but not limited to, chemical vapor deposition and physical vapor deposition. The depression may be configured to include suitable sidewalls, a bottom wall, and the like. Thus, by way of nonlimiting examples, the geometric depression or cavity may be one as would be formed in producing various configurations such as inkjet device chambers, display device pixel chambers, or other chambers which typically require hermetic sealing to contain a fluid or a gaseous material. The geometric depression or cavity may or may not contain various microstructures or microelectromechanical (MEMS) system structures depending upon system requirements. As used herein, the term "microelectromechanical system" is to be broadly construed as miniaturized and subminiaturized systems including, but not limited to, silicon-based mechanical devices, chemical and biological actuators, and miniature non-silicon structures, for example, devices made of plastics or ceramics. It is contemplated that such systems may comprise sensing, processing, and/or actuating functions. "Microstructures" as used herein is taken to mean configurations and architectures developed on the associated device. These can include, but are not limited to flexures, posts, hinges and the like.

The core material employed is a bistate material that exists in an initial fluid state and is different from but compatible with the substrate and achieves solidification due to a solidification process. The solidification process may be reversible, partially reversible, or is reversible and may be the result of a physical or chemical process. Examples of such processes include, but are not limited to, temperature change, polymerization, monomeric crosslinking, monomeric/polymeric gel crosslinking, and the like. The core material is a material that will permit conformation with the configuration of the geometric depression and any devices contained therein in both its initial fluid state and in its solidified state. "Compatibility" is taken to include both thermal and chemical compatibility with the material defining the depression, i.e., the substrate and the material of any microstructures, MEMS structures and the like contained therein.

The bistate core material employed and introduced into the geometric depression in the substrate may be a material that exists in a solidified state at a first condition or environment and an essentially fluidized state at a second condition or environment. As used herein the term "environment" is taken to mean at least one characteristic or factor affecting the state of the core material. Nonlimiting examples of characteristics include at least one of temperature and magnetic field. The characteristic or factor may be one that occurs external to the chamber in which the core material is contained. Where desired or required, the factor or characteristic can be altered or affected by events triggered within the chamber or associated device elements.

Where at least one characteristic of the environment is temperature, the core material may be one that exists in a solidified state at a first temperature and an essentially fluidized state at a second temperature greater than the first temperature. Typically, the fluidization temperature is one that permits introduction of fluidized core material into the geometric depression defined in the substrate without damage or degradation to the substrate material. Alternately, it is contemplated that the bistate core material may be a material that can be introduced in an initial fluid state and subsequently be solidified by a suitable process such as cross-linking induced by any suitable chemical or physical process as would be known to the artisan.

Materials and compounds that can be employed in the process disclosed herein include various waxes and polymers having melting or fluidization temperatures and solidification temperatures suitable for use with semiconductor materials. Nonlimiting examples of these include various waxes, naphthalene, naphthalene derivatives, acrylic acid monomers, derivatives of acrylic acid monomers, acrylic acid polymers, camphor, camphor derivatives, camphinic acid polymers, and polyesters. Useful formulations include those which include at least one of polyglutarimides such as polymethyl glutarimides (PMGI), polydimethyl glutarimides, substituted cycloalkenes such as benzocyclobutene, and acrylic acid derivatives such as alkyl acrylates of which polymethyl methacrylate is one example.

In the fabrication processes and methods disclosed herein, the introduced core material conforms to the geometric depression. Once solidified, the core material provides at least one outer surface that can be utilized to support formation of at least one of the walls of the chamber to be formed.

The outer surface of the introduced core material can be prepared to support and form the wall of the desired chamber and to impart suitable characteristics to the chamber wall surface so formed. Preparation can be to a layer receiving tolerance providing desired characteristics such as planarity and conformity as at reference numeral 120.

As used herein, "planarity" is defined as surface characteristics and topographical deviation within defined tolerances appropriate for the layer to be imparted thereon. Thus, where specific surface smoothness or layer thickness is required, it is contemplated that the outer surface of the solidified core material will be prepared to provide an inwardly facing layer surface within acceptable deviation.

The term "conformity" as used herein is taken to mean the integration or contact between the solidified core material and surrounding substrate in an essentially uniform continuous manner devoid of discontinuities and irregularities, particularly at the junction between substrate and core material.

Preparation to layer receiving tolerance can be accomplished by any suitable process including, but not limited to, planing, polishing, and the like. As indicated previously, planing and/or polishing can be accomplished by any suitable physical, chemical, or physical/chemical method. It is contemplated that the planing/polishing process can be one actionable on the outer surface core material alone, providing it with suitable surface characteristics. It is also contemplated that the planing/polishing process may be one that brings the outer surface of the core material into dimensional conformance with the surrounding substrate surface, providing a flat planar continuous surface for establishment of subsequent layers.

As the term "layer receiving tolerance" is employed herein, it is contemplated that the outer surface of the introduced core material will have a desired planarity suitable for deposition of an overlying layer and formation of the inner wall of the desired chamber. Planarity can be ascertained and defined, depending upon the end use of the desired electronic device. However, as broadly construed, it is contemplated that the outer surface of the core material will precisely conform to the substrate architecture and boundaries surrounding the geometric depression. It is also contemplated that characteristics such as planarity will be adapted for the ultimate end use to which the electronic device is to be placed. Thus, where the electronic device is to be used in an optically transmissive and/or receptive activity, it is contemplated that the planar tolerances will be those suitable for optical transparency, transmission, or the like.

In the process as disclosed herein, a layer (e.g. material layer) is then established in overlying relationship with the prepared outer surface of the core material and surrounding substrate as at reference numeral 130. The material layer may be established by a suitable deposition process. Nonlimiting examples of suitable deposition processes include additive processes such as direct line-of-sight impingement deposition such as sputtering, ion plating, and various other physical vapor deposition techniques. Nonlimiting examples of suitable additive processes also include diffusive-convective mass transfer techniques commonly referred to as chemical vapor deposition. Other suitable deposition techniques include spray coating, roller coating, spin coating, and the like.

The established outer layer can be further processed as desired or required to produce the desired finished outer layer. For example, the deposited outer layer can be exposed to various curing processes to achieve cross-linking, bonding between the outer layer and the substrate, and the like. Examples of such processes include those typically used for coating and lens fabrication. A nonlimiting example of suitable post-deposition curing processes includes those suitable for use with spin-coat polymeric films having thicknesses greater than about 10 µm utilizing materials such as multi-functional epoxy derivatives of bis-phenol-A novolak. Such materials are discussed in U.S. Pat. No. 5,102,772 to Angelo et al., the specification of which is incorporated herein by reference.

Curing processes may include, but are not limited to cationic polymerization initiated by various mechanisms including ultraviolet light (particularly in the range of 365 to 436 nm), electron bombardment, and x-ray bombardment sufficient to include a high level of cross-linking density converting materials such as hot epoxies discussed above into suitable polymeric materials.

Materials that can be employed as suitable wall materials include various materials used in the practice of film production. In optical microelectromechanical devices, it is contemplated that the wall material may be materials having a suitable light transmissivity, reflectivity characteristics, or the like when employed as film layers. Examples of wall material include, but are not limited to, acrylates, epoxies, polycarbonates, and polyimides. Materials of choice may be those composed of cationically polymerizable monomers such as epoxies and vinyl compounds. In another aspect, it is contemplated that materials such as tetraethyl orthosilicate (TEOS), silicate, polycarbonate, magnesium fluoride, and quartz may be employed.

Upon completion of the outer layer deposition process, it is contemplated that sealed engagement between the material layer and the substrate will be achieved with the core material contained in the sealed chamber. Subsequent to deposition of the material layer, the solidified core material contained in the chamber can be converted to a suitable fluidized material. Conversion to a suitable fluidized material may occur by any suitable chemical or physical process. Thus, where low melting waxes are employed, the solidified core material will be returned to a fluid state by temperature elevation.

Depending upon the end use to which the electronic device is to be placed, the core material may be retained within the chamber so formed or may be removed in a subsequent step. It is contemplated that removal of the core material can be accomplished through appropriate vias or filler ports prepared in the substrate. Where at least a portion of the fluidized core material is retained in the chamber subsequent to the outer layer deposition step, it is contemplated that the core material is one that can be utilized with the operation of the microelectromechanical device or, at minimum, does not interfere with the function of the device. Thus, depending upon the end use, the core material of choice will possess suitable dielectric, light transmissive qualities and the like. For example, in configurations where the chamber contains at least one micromirror, it is contemplated that the core material in its fluid state will exhibit a low melt temperature and low viscosity under operational conditions.

Figure 2:
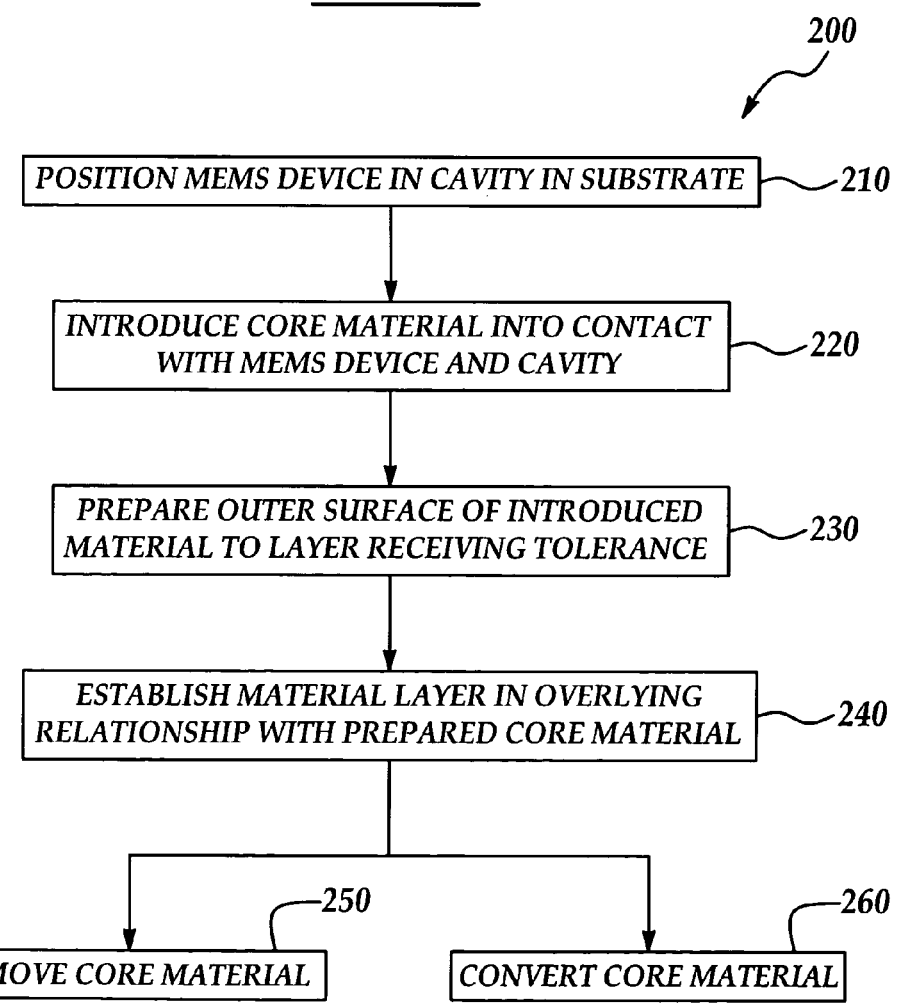
FIG. 2 is a detailed process flow diagram of an embodiment of a chamber forming method disclosed herein.

A more detailed process diagram depicting the method as disclosed herein is outlined in FIG. 2 in which a suitable MEMS device is positioned in a cavity prepared in a substrate as set forth at reference numeral 210. Positioning can be accomplished by any suitable microfabrication methods. Examples of these include, but are not limited to, die attachment and wire bonding as well as other microfabrication techniques known to the skilled artisan. As disclosed previously, the geometric depression or cavity defined in the substrate can have any suitable geometry and/or configuration as desired or required for the resulting chamber.

It is contemplated that the substrate may be any material appropriate for formation of the cavity, associated chamber, and ultimately the electronic device. Thus, the substrate can be one capable of supporting appropriate CMOS architecture. It is also considered within the purview of this invention to build appropriate architecture on a suitable substrate to house the chamber and any associated MEMS devices.

Once the MEMS device is in position, core material may be introduced into contact with the MEMS device and the associated cavity as at reference numeral 220. As indicated previously, the bistate core material can have suitable properties permitting it to be present in a fluid state or a solid state depending on, for example, field stress. It is contemplated that the core material can be a "bifunctional material". As the term "bifunctional material" is used herein, the material exhibits a fluid state at a first condition and a solidified state at a second condition. It is to be understood that in the solid state, the material substantially functions as a core material and in the fluid state, the core material may have additional properties such as optical modulation and modified refractive index that may, in some instance, aid in the optimal operation of an incorporated MEMS device. The conditions are governed, at least in part by at least one outside field stress. Examples of outside field stress include, but are not limited to, conditions such as temperature magnetic field operations and the like. Thus it is contemplated that a bifunctional fluid can be in a fluid state at a first temperature, and a solidified state at a second temperature lower than the first temperature. Similarly, the bifunctional material can exhibit a fluid state in response to a first magnetic field condition and a solidified state in response a second magnetic field condition.

It is contemplated that the core material can be introduced into comprehensive contact with the respective cavity surfaces and the MEMS device. As used herein, the term "comprehensive contact" is taken to mean essentially continuous contact with the respective chamber surfaces and MEMS device devoid of voids, bubbles and the like.

The core material may contain at least one of low melting waxes, naphthalene, naphthalene derivatives, acrylic monomers, acrylic polymers, camphor, camphor derivatives, camphinic acid derivatives, and polyesters. Typically, materials of choice will be ones capable of existing in a fluid state at a first temperature and transforming to a solid state at a lower temperature. It is contemplated that the bifunctional core material will be capable of conversion back into the fluid state upon temperature elevation or other triggering event. The core material of choice will be one capable of conformal contact with the MEMS device and the cavity. The core material, once in place in the cavity, will provide an outer surface region suitable for subsequent processing and fabrication.

Once the core material is in place, the outer surface of the introduced core material is prepared to receive an overlying material layer as at reference numeral 230. It is also contemplated that other operation and fabrication steps can be employed. Non-limiting examples of such fabrication steps include operations such as packaging, mounting, and dicing of the associated substrate wafers. The core material can function to protect microelectromechanical devices as well as other microstructures.

The material layer may be established in overlying relationship with the prepared core material as at reference numeral 240. It is contemplated that the outer material layer can be established by a suitable deposition process. Deposition can be by any suitable process that will provide a layer of appropriate thickness and dimensions. It is also contemplated that the deposition process of choice will be one that will permit sealing attachment between the deposited layer and surrounding substrate to achieve a sealed bond between the material layer and the substrate.

Once the material layer is in sealing overlying relationship with the core material and associated substrate, the core material can be either removed from the chamber thus formed, as at reference numeral 250, or can be converted and used as desired or required as at reference numeral 260.

Removal of core material can be accomplished by various methodologies. The core material can be heated to a fluidized state and purged by subjecting the chamber to an appropriate vacuum or to a pressurized inert gas such as nitrogen. Other suitable removal processes include solvent exposure with or without associated gas purge and/or heating procedures. Non-limiting examples of suitable solvents include xylene, gamma butyl acetone, cyclopentatone, anisole, hexane, cyclohexane, methyl isobutyl ketone (MIBK), and the like. Once the core material has been removed, the chamber can be filled and sealed as desired or required.

Where core material removal is desired, it is contemplated the removal process may occur at any suitable point in the fabrication process. Thus, it is contemplated that the conformal material may be retained in the defined chamber during at least some subsequent fabrication processes to act as a protective medium for delicate microelectromechanical devices contained therein. Such processes include, but are not limited to, wafer packaging, mounting dicing and the like.

Alternately, it is contemplated that the core material may be converted into a form useful during subsequent operation of the electronic device. Such conversion can occur as a result of temperature change, and/or chemical conversion. In such instances, it is contemplated that the core material can be converted from a solid to a fluid material that can support MEMS device function. Such conversion may occur by any suitable mechanical or chemical process of which temperature elevation is but one example.

It is contemplated that temperature elevation may be accomplished as a result of operation of the electronic device, ambient temperature exposure, or other environmental factor surrounding the device itself. Conversion can be either one way or bidirectional. Thus, it is contemplated that, when core material is retained in the chamber, the core material may convert to a functional fluid state upon temperature elevation or other triggering event and be retained in this state. It is also contemplated that the core material may revert back to its solid state depending upon temperature conditions.

In various situations, the manufacturing of microelectromechanical system devices, such as micromirrors, Fabry-Perot devices, and diffraction-based devices, can be difficult because of the fragility of the MEMS components. Manufacturing operations can include, but are not limited to, operations such as sawing and packaging. This can be complicated in manufacture of optical MEMS devices having transparent package requirements.

It is contemplated that the bistate core material, in its solid form, can function to protect the delicate microelectromechanical system device elements during assembly and manufacture. Once manufacture has been completed, the core material may be converted and/or removed as desired or required.

Figure 3A:
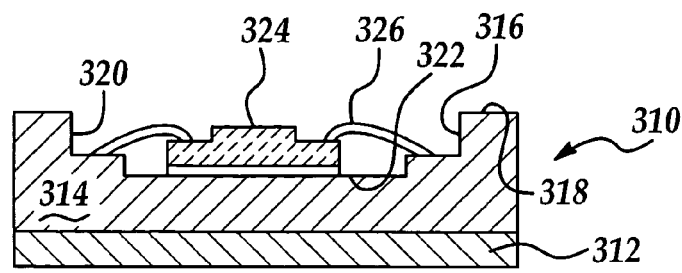
FIGS. 3A through 3D is a cross section sequential depiction of an embodiment of an integrated circuit device prepared by an embodiment of the process disclosed herein.

The method for forming at least one enclosed chamber can be further illustrated and exemplified by reference to drawing FIGS. 3A, 3B, 3C, and 3D, which illustrate a build sequence. As seen in FIG. 3A, an unfinished integrated circuit device 310 includes a suitable substrate 312 with appropriate architectural structure 314 fabricated thereon. Fabrication of the architectural structure 314 can be by any suitable build or fabrication sequence. The resulting architectural structure 314 has at least one geometric depression 316 extending from an upper region 318 of the architectural structure 314 into the body of the architectural structure 314 to a location proximate to the substrate 312.

In an embodiment as depicted in FIGS. 3A, 3B, 3C, and 3D, the electronic device 310 is depicted as having at least one geometric depression 316 that encompasses a major portion of the device for simplicity in illustration. It is to be understood that the geometric depression 316 can be of any suitable size and/or configuration desired or required for the finished electronic device. Multiple depressions 316 may also be configured as required or dictated by the end use of the electronic device. Typically, the geometric depression 316 will have at least one sidewall structure 320 and a contiguously positioned floor structure 322.

As depicted in FIG. 3A, the electronic device 310 under fabrication also includes a suitable microelectromechanical device 324 mounted to a suitable structure of the geometric depression 316 such as floor 322. The microelectromechanical device 324 may have suitable wire bonds 326 providing attachment and electronic communication between the microelectromechanical device 324 and other elements either present on the device 310 or remote thereto.

As disclosed herein, the method for forming at least one enclosed chamber contemplates utilization of a preconfigured unfinished integrated circuit device 310 having a microelectromechanical device 324 already positioned thereon. The method also contemplates processes whereby the microelectromechanical device 324 may be positioned on the integrated circuit device architecture as part of the formulation process. Mounting or positioning of the microelectromechanical device 324 into the integrated circuit device structure can be by any suitable method.

Figure 3B:
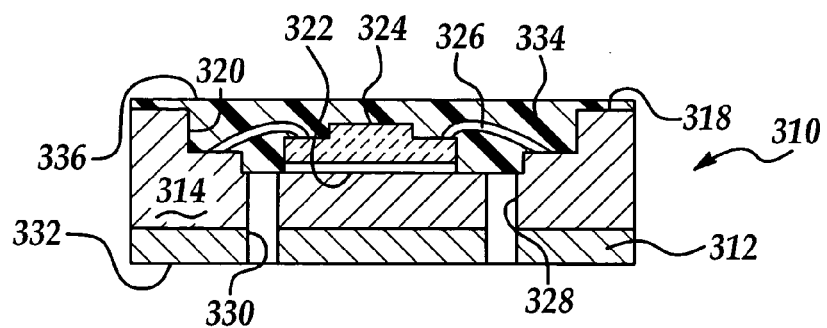

As illustrated in FIG. 3B, suitable vias, orifices, or access ports 328, 330 can be prepared in the substrate 312. As depicted, vias 328, 330 extend from a lower face 332 of the substrate 312 and terminate at the floor 322 of the geometric depression 316. The vias 328, 330 can be temporarily or permanently filled with a suitable plug material.

It is to be understood that such vias 328, 336 can be considered optional. Vias 328, 330 provide appropriate access to the interior of the geometric depression 316 for subsequent removal of core material and/or substitution of materials in the chamber that is ultimately to be formed. However, in situations where the core material is to remain in the chamber to be formed, such access ports 328, 330 may be omitted.

Introduction of the core material 334 can occur by any suitable method providing for efficient introduction of the material into all areas in the depression 316. The material may be introduced through any suitable opening including the upper face of the geometric opening 316 or through orifice 328, 330 in the case of a reverse entry procedure. The material of choice may vary and may be one that is compatible with the materials in the architectural structure 314 and any microelectromechanical devices 324 and wire bonds 326 which may be present therein. The core material 334 conforms to the geometry of the geometric depression 316 to provide at least a temporary support structure. Suitable core materials 334 include, but are not limited to, low melting wax, naphthalene, naphthalene derivatives, acrylic monomers, acrylic polymers, camphor, camphor derivatives, camphinic acid polymers, polyesters, and/or mixtures thereof. Suitable materials may be introduced into the geometric depression 316 in a liquid state and can experience solidification due to temperature change, cross linking, or the like.

Addition of the core material 334 results in a filled geometric depression 316. The core material 334, upon solidification, provides an outer face 336. As depicted in FIG. 3B, it is contemplated that the core material 334 can be added in a manner which overfills or overlies upper surface 318 of the architectural structure 314 surrounding geometric depression 316. In this manner, adequate material can be introduced to permit overlayment and additional surface preparation.

Figure 3C:
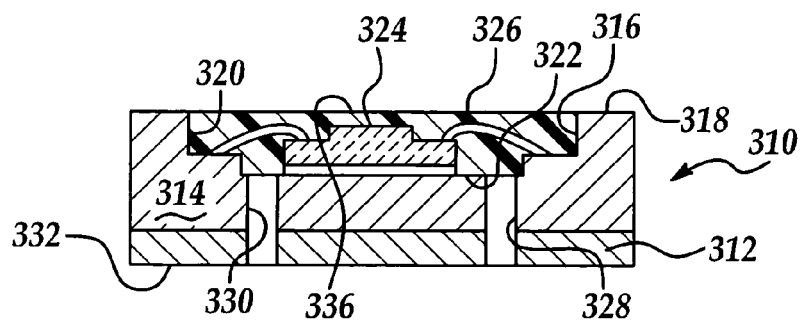

As depicted in FIG. 3C, it is contemplated that preparation of the outer surface 336 of the core material 334 can include operations such as leveling, planing, and the like to provide a surface having tolerances appropriate for subsequent deposition of an overlying layer. Thus, in situations where optical transmission or transparency is required, it is contemplated that the outer surface 336 of core material 334 will be planed or leveled to obtain appropriate qualities for the inner surface of an overlying layer. In FIG. 3C, the outer surface 336 is leveled to conform to the upper surface 318 of the surrounding architectural structure 314.

Figure 3D:
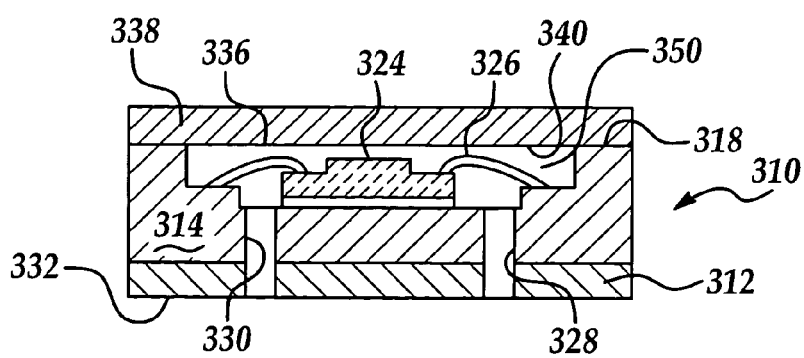

As illustrated in FIG. 3D, after suitable surface preparation of the core material 334, an overlying upper layer 338 can be deposited into overlying relationship with the upper surface 318 of the architectural structure 314, the substrate 312, and the outer surface 336 of core material 334. Deposition of the overlying/outer/upper layer 338 can be accomplished by any process permitting engagement between the upper surface 318 of the architectural structure 314 and the lower face 340 of the outer layer 338 in a sealing manner. An example of such processes includes spin-bonding and curing as would be employed in coating and lens fabrication.

As can be appreciated from FIG. 3D, the lower surface 340 of the outer layer 338 may be essentially conformal and contiguous through the bonded regions and the region contacting the upper surface 336 of core material 334.

Depending upon the end use for the electronic device 310, the core material 334 can be removed as depicted in FIG. 3D, to form chamber 350. The chamber 350 may be hermetically sealed. A different material may be introduced into the chamber 350 as desired or required. Where material substitution is desired, it is contemplated that the core material 334 may be fluidized and purged by use of a vacuum or inert gas administered through opened orifices 328, 330. Fluidization may be accomplished by suitable means such as heating the assembly or localized regions thereof. It is also contemplated that various solvents can be employed in addition to or in place of the purging process. Nonlimiting examples of such solvents include xylene, butrylacetone, cyclopentanone, anisol, hexane, cyclohexane, methyl isobutyl ketone (MIBK) and the like. It is also contemplated that various aqueous alcohol mixtures can be utilized as desired or required.

Figure 4A:
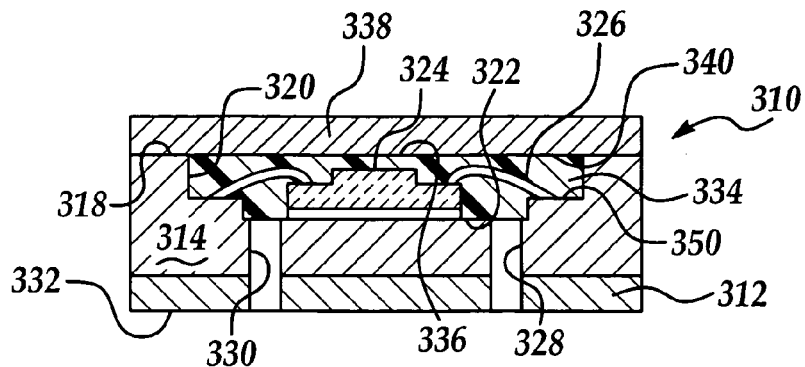
FIGS. 4A and 4B are optional steps that can occur subsequent to an embodiment of the process disclosed herein.
Figure 4B:
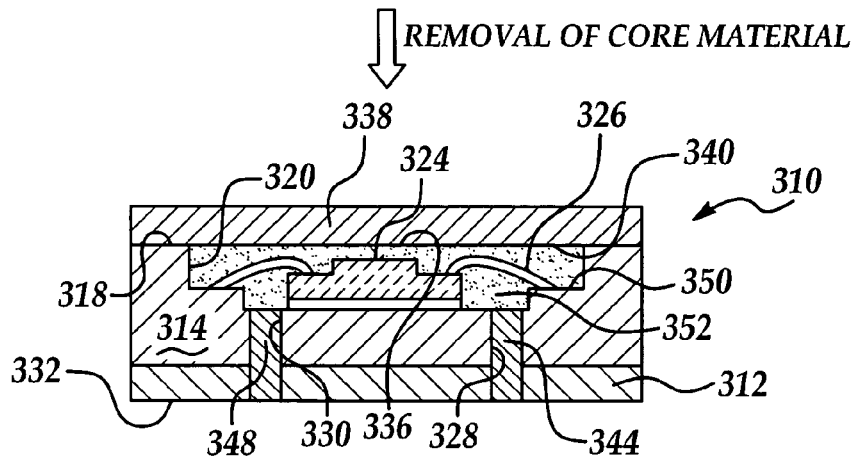

It is also contemplated that the core material 334 can be replaced by a suitable operating liquid or gas 352, as depicted in FIG. 4B. Referring to FIGS. 4A and 4B together, the device 310 having the upper layer (in one embodiment an optical quality layer) 338 affixed thereto, may have core material 334 evacuated to form chamber 350, which is defined by the optical quality layer 338 and the geometric depression 316 (as shown in FIG. 3D). Once the core material 334 has been removed, a suitable fluid such as a dielectric fluid or an appropriate gas 352 can be introduced into the defined chamber 350 if desired or required through vias 328, 330. The openings 328, 330 can be sealed as with filler port plug 342, 348 and the device 310 made ready for use as desired or required.

Figure 5:
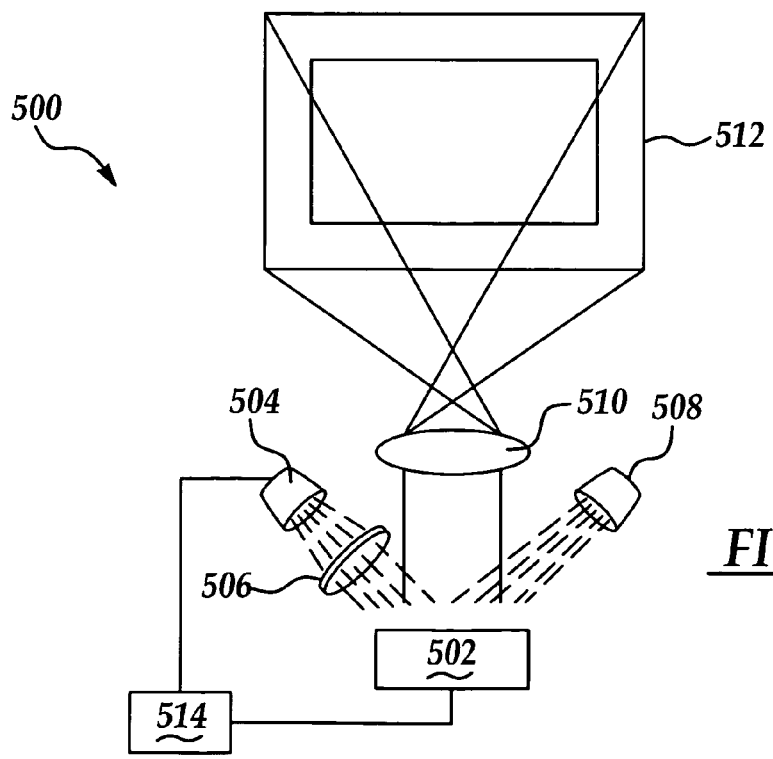
FIG. 5 is a schematic view of a display device utilizing an electronic device having a chamber as described herein.

The device disclosed herein may be employed in conjunction with suitable display devices. One non-limiting example is a spatial light modulator utilized in the device as depicted in FIG. 5. FIG. 5 is a schematic view of an image projection system 500 using a MEMS device 502 as depicted herein.

One non-limiting example of a MEMS device 502 is a micromirror device. In FIG. 5, light from light source 504 directed on a first light path is focused on the MEMS device 502 by lens 506. Although shown as a single lens, lens 506 is typically a group of lenses, integrators, and mirrors that together focus and direct light from light source 504 onto the surface of MEMS device 502. Image data and control signals from controller 514 are written onto a suitable SRAM cell, DRAM cell, or the like, associated with each MEMS devices 502. The data in these associated cells cause actuation of some of the MEMS devices 502 to an "on" position. In the "on" position light is directed to a second light path. Cells in the MEMS device 502 that are in an "off" or rest position can direct light into a light trap 508 or away from the second light path.

The projection system 500 may include at least one element 510 on the second light path for resolving the selectively directed light. One non-limiting example of such element 510 is a projection lens. While a single element 510 is depicted in FIG. 5, it is contemplated that multiple elements may be utilized. As depicted, the projection lens focuses the light directed to the second light path by device 502 onto a single image plane or screen 512.

While several embodiments have been described in detail, it will be apparent to those skilled in the art that the disclosed embodiments may be modified. Therefore, the foregoing description is to be considered exemplary rather than limiting.

What is claimed is:

1. A method for forming a chamber in an electronic device, the method comprising:
    preparing an outer surface on a solidified bifunctional core material, the solidified bifunctional core material in a depression formed in a substrate; and
    establishing a layer on the prepared outer surface of the solidified bifunctional core material and a portion of the substrate surrounding the depression, the established layer and the substrate defining a chamber.

2. The method of claim 1 wherein the established layer is composed of an optically transmissive material.

3. The method of claim 1 wherein the substrate is one of a semiconductor material and an optically transmissive material.

4. The method of claim 1 wherein the bifunctional core material exhibits a solidified state at a first temperature and a fluidized state at a second temperature greater than the first temperature.

5. The method of claim 1 wherein prior to preparing the outer surface, the method further comprises solidifying the, bifunctional core material by at least one of temperature change, polymerization, and cross-linking.

6. The method of claim 1 wherein the core material contains at least one of low melting waxes, naphthalene, naphthalene derivatives, acrylic monomers, acrylic polymers, camphor, camphor derivatives, camphinic acid polymers, polyesters, or mixtures thereof.

7. The method of claim 1, further comprising converting the solidified bifunctional core material contained in the chamber into a fluidized bifunctional core material subsequent to establishing the layer.

8. The method of claim 7, further comprising removing at least a portion of the fluidized bifunctional core material from the chamber subsequent to converting the solidified bifunctional core material.

9. The method of claim 7, further comprising operating the electronic device with at least a portion of the fluidized bifunctional core material present in the chamber.

10. The method of claim 1 wherein establishing the layer is accomplished by at least one of spin deposition or sputter deposition.

11. The method of claim 1 wherein the layer is formed of an optical quality material, the optical quality material including at least one of acrylates, epoxies, polycarbonates, polyimides, TEOS, silicate, polycarbonate, magnesium fluoride, quartz, or glass.

12. The method of claim 1, further comprising removing at least a portion of the bifunctional core material after the layer has been established.

13. The method of claim 12 wherein removing comprises at least one of sublimation, solvent dissolution, melting, or gas purging.

14. The method of claim 1 wherein the electronic device has a minimum operating temperature and wherein the bifunctional core material solidifies at a temperature below the minimum operating temperature for the electronic device.

15. The method of claim 5, further comprising:
   positioning at least one microelectromechanical device in the depression, the positioning occurring prior to preparing the outer surface; and
   introducing the bifunctional core material into the depression such that the bifunctional core material and the depression are in conforming relationship to each other, the introducing occurring prior to the solidifying.

16. The method of claim 15 wherein the microelectromechanical device is an optic MEMS device.

17. A process for making an optical microelectromechanical device, comprising:
   introducing a bifunctional core material into a cavity defined in a substrate; and
   establishing a layer on the bifunctional core material and the substrate, the layer and substrate defining a sealed chamber therebetween.

18. The process of claim 17 wherein the layer has an optical quality including at least one of optical transmission, reflectance, and diffraction.

19. The process of claim 17 wherein the cavity contains a microelectromechanical device and the bifunctional core material is placed in comprehensive contact with the microelectromechanical device and conformal relationship with the cavity.

20. The process of claim 17 wherein the bifunctional core material has at least two physical states, the two physical states including at least a solidified state at a first condition and a fluidized state at a second condition.

21. The process of claim 20 wherein the first and second conditions are first and second temperatures, wherein the second temperature is greater then the first temperature, wherein the bifunctional core material is introduced at a temperature at least as great as the second temperature, and wherein the establishing occurs while the bifunctional core material is in the solidified state.

22. The process of claim 20, further comprising removing the bifunctional core material subsequent to establishing.

23. The process of claim 20, further comprising maintaining the bifunctional core material in the sealed chamber during operation of the device.

24. The process of claim 17, further comprising preparing a surface on an outer face of the bifunctional core material prior to establishing.

* * * * *

UNITED STATES PATENT AND TRADEMARK OFFICE
CERTIFICATE OF CORRECTION

PATENT NO. : 7,410,816 B2
APPLICATION NO. : 10/807887
DATED : August 12, 2008
INVENTOR(S) : Makarand Gore et al.

It is certified that error appears in the above-identified patent and that said Letters Patent is hereby corrected as shown below:

In column 8, line 40, delete "328, 336" and insert -- 328, 330 --, therefor.

In column 10, line 49, in Claim 5, after "solidifying the" delete ",".

In column 12, line 18, in Claim 21, delete "then" and insert -- than --, therefor.

Signed and Sealed this

Eleventh Day of November, 2008

JON W. DUDAS
*Director of the United States Patent and Trademark Office*